(12) United States Patent
Clingman et al.

(10) Patent No.: US 7,732,994 B2
(45) Date of Patent: Jun. 8, 2010

(54) NON-LINEAR PIEZOELECTRIC MECHANICAL-TO-ELECTRICAL GENERATOR SYSTEM AND METHOD

(75) Inventors: Dan J. Clingman, Auburn, WA (US); Darin J. Arbogast, Auburn, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 12/203,382

(22) Filed: Sep. 3, 2008

(65) Prior Publication Data
US 2008/0315722 A1    Dec. 25, 2008

Related U.S. Application Data

(63) Continuation of application No. 11/551,515, filed on Oct. 20, 2006, now Pat. No. 7,436,104.

(51) Int. Cl.
*H01L 41/113* (2006.01)
*H01L 41/00* (2006.01)
(52) U.S. Cl. ......................................... 310/339; 310/26
(58) Field of Classification Search .................. 310/26, 310/339
See application file for complete search history.

(56) References Cited

U.S. PATENT DOCUMENTS

| | | | |
|---|---|---|---|
| 6,858,970 B2 | 2/2005 | Malkin et al. | |
| 7,388,321 B2 * | 6/2008 | Hattori et al. | 310/311 |
| 7,436,104 B2 * | 10/2008 | Clingman et al. | 310/339 |
| 7,439,657 B2 * | 10/2008 | Clingman et al. | 310/339 |
| 7,521,841 B2 * | 4/2009 | Clingman et al. | 310/339 |
| 2008/0092354 A1 | 4/2008 | Clingman et al. | |
| 2008/0100179 A1 | 5/2008 | Ruggeri et al. | |
| 2008/0100180 A1 | 5/2008 | Clingman et al. | |
| 2008/0150395 A1 | 6/2008 | Clingman et al. | |
| 2008/0191584 A1 | 8/2008 | Malkin et al. | |

* cited by examiner

*Primary Examiner*—Thomas M Dougherty
(74) *Attorney, Agent, or Firm*—Harness, Dickey & Pierce, P.L.C.

(57) ABSTRACT

A non-linear power generator system that may include a flexible beam for receiving a mechanical input, the flexible beam being supported in a bowed configuration; an electrically responsive member supported adjacent one end of the flexible beam so as to be under a compressive force exerted by the flexible beam; and the flexible beam being adapted to move towards a flattened shape from the bowed shape in response to the mechanical input, to transmit the mechanical input to the electrically responsive member, to cause a compression of the electrically responsive member that results in an electrical output signal being generated by the electrically responsive member.

20 Claims, 4 Drawing Sheets

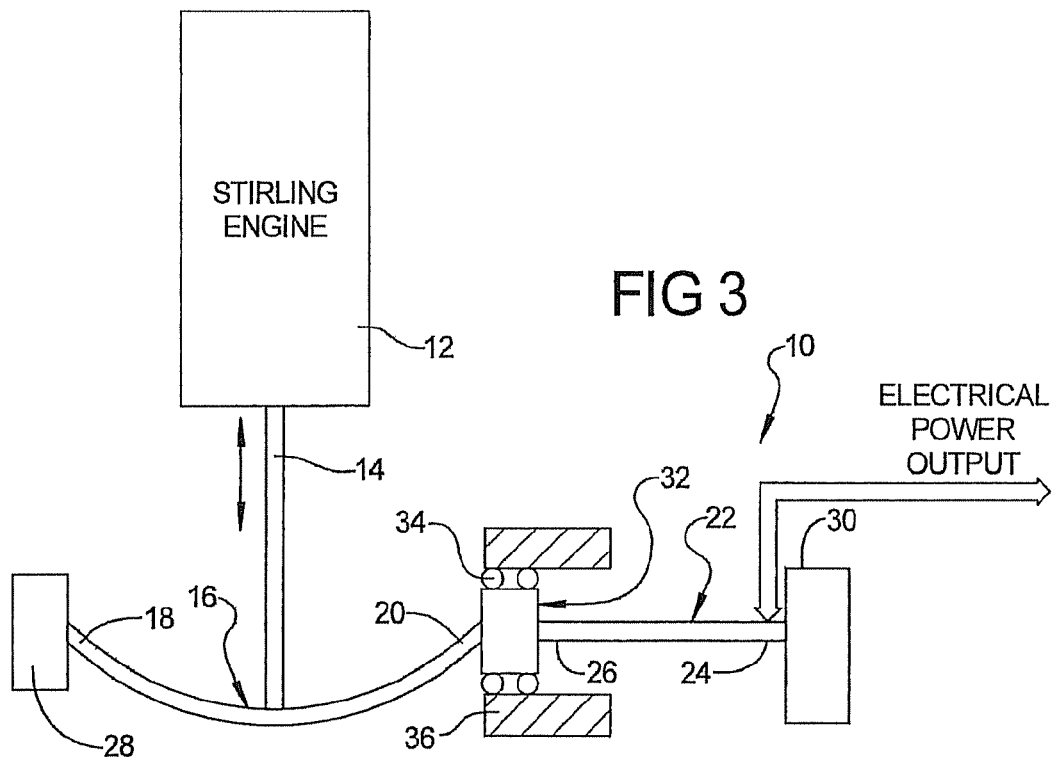
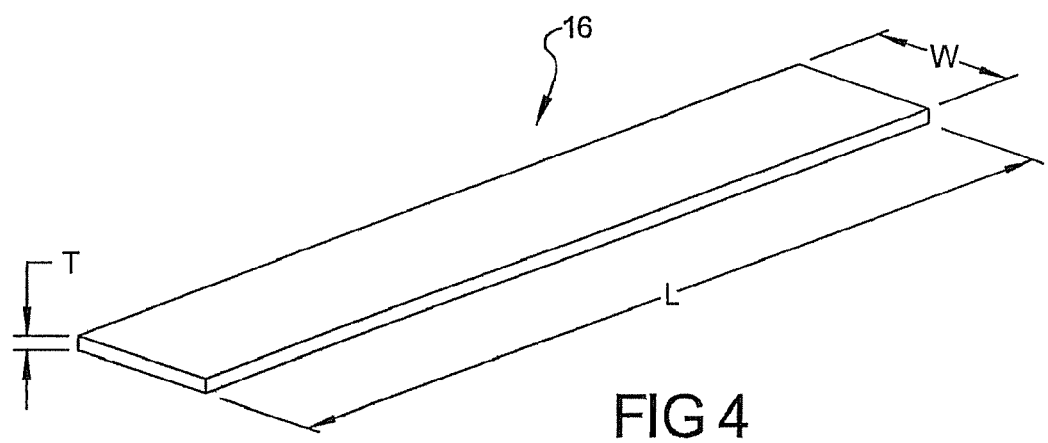

NON-LINEAR PIEZOELECTRIC MECHANICAL-TO-ELECTRICAL GENERATOR SYSTEM AND METHOD

CROSS REFERENCE TO RELATED APPLICATIONS

This application is a continuation of U.S. patent application Ser. No. 11/551,515 filed on Oct. 20, 2006.

FIELD

The present disclosure relates to piezoelectric devices, and more particularly to a nonlinear piezoelectric generator that generates electrical power from a mechanical input.

BACKGROUND

Piezoelectric devices are presently being employed in greater numbers of applications and in a wide ranging area of technologies. Piezoelectric devices make use of one or more piezoelectric ceramic wafers that are adapted to bow or deform in response to an electric current applied to the wafer. Such piezoelectric wafers also produce an electrical output when they are flexed or deformed from an initial, non-flexed configuration. Thus, piezoelectric wafers are especially useful in applications involving actuators and vibration energy harvesting apparatuses. The following U.S. patents and applications involve various implementations of piezoelectric materials, and are each hereby incorporated by reference into the present application: U.S. Pat. No. 6,858,970 and U.S. Ser. No. 10/909,784, filed Jul. 30, 2004.

Another device which has only recently achieved practicality is a Stirling engine. Stirling engines have existed in various forms for many years, however, it has been recent breakthroughs in the design of engine chamber seals that has made these devices practical. A Stirling engine utilizes temperature gradients to convert thermal energy into mechanical energy. Typically, the Stirling engine includes one or more pistons that are driven in a reciprocating fashion by converting thermal energy into mechanical energy. Recently, Stirling engines have shown promise as a low cost, high efficiency solar powered generator for U.S. power grid and spacecraft electric power generation systems. The ability of the Stirling engine to meet or exceed the performance of concentrated photovoltaics has been recently recognized by engineers and researchers interested in exploring alternative power generation systems for use in spacecraft.

One drawback with a typical Stirling engine is that the mechanical energy is typically converted to electrical energy using a very large AC electromagnetic generator. A large electromagnetic generator, however, can be a serious drawback for spacecraft applications, where weight is an important consideration.

Thus, it would be highly desirable to provide some means for generating electric power from a mechanical input device, for example, from one or more pistons of a Stirling engine. It would further be highly desirable if such a device formed a small, lightweight, and highly efficient apparatus for converting mechanical energy to electrical power. Such a device would significantly enhance the utility of other components, such as Stirling engines. Such a device could enable a Stirling engine to be used in various power generating applications which, at the present time, are not feasible because of the size and weight of typical electromagnetic generators presently employed for use with Stirling engines in power generating applications.

SUMMARY

In one aspect the present disclosure relates to a non-linear power generator system that may include: a flexible beam for receiving a mechanical input, the flexible beam being supported in a bowed configuration; an electrically responsive member supported adjacent one end of the flexible beam so as to be under a compressive force exerted by the flexible beam; and the flexible beam being adapted to move towards a flattened shape from the bowed shape in response to the mechanical input, to transmit the mechanical input to the electrically responsive member, to cause a compression of the electrically responsive member that results in an electrical output signal being generated by the electrically responsive member.

In another aspect the present disclosure relates to a non-linear, mechanical-to-electrical power generator that may include: a flexible beam secured at a first end to a first structure, and at a second end to a coupling assembly, and being held between the first structure and the coupling assembly in a compressed, non-linear orientation; an electrically responsive member supported adjacent the flexible beam and to a second structure; and the flexible beam adapted to receive a mechanical input force at a point along its length that flexes the flexible beam, and concurrently causes the electrically responsive member to be compressed and to generate an electrical output signal.

In another aspect the present disclosure relates to a method for generating electrical power from a mechanical input signal. The method may include: using a flexible beam secured under compression to assume a bowed orientation, to receive the mechanical input signal; using the flexible beam to transmit the mechanical input signal to an electrically responsive member; supporting the electrically responsive member such that the member experiences a compressive stress from the flexible beam when the flexible beam moves from the bowed orientation to a flattened orientation; and using the flexible beam to alternatively compress and decompress the electrically responsponsive member, in response to the mechanical signal, to generate electrical output signals from the electrically responsive member.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 3 is a simplified block diagram of the apparatus of FIG. 2, but with the piston of the Stirling engine fully extended to force the flexible beam past an over center position to a new bowed orientation;

FIG. 4 is a perspective view of the flexible beam;

DETAILED DESCRIPTION

The following description is merely exemplary in nature and is not intended to limit the present disclosure, application, or uses.

Figure 1:
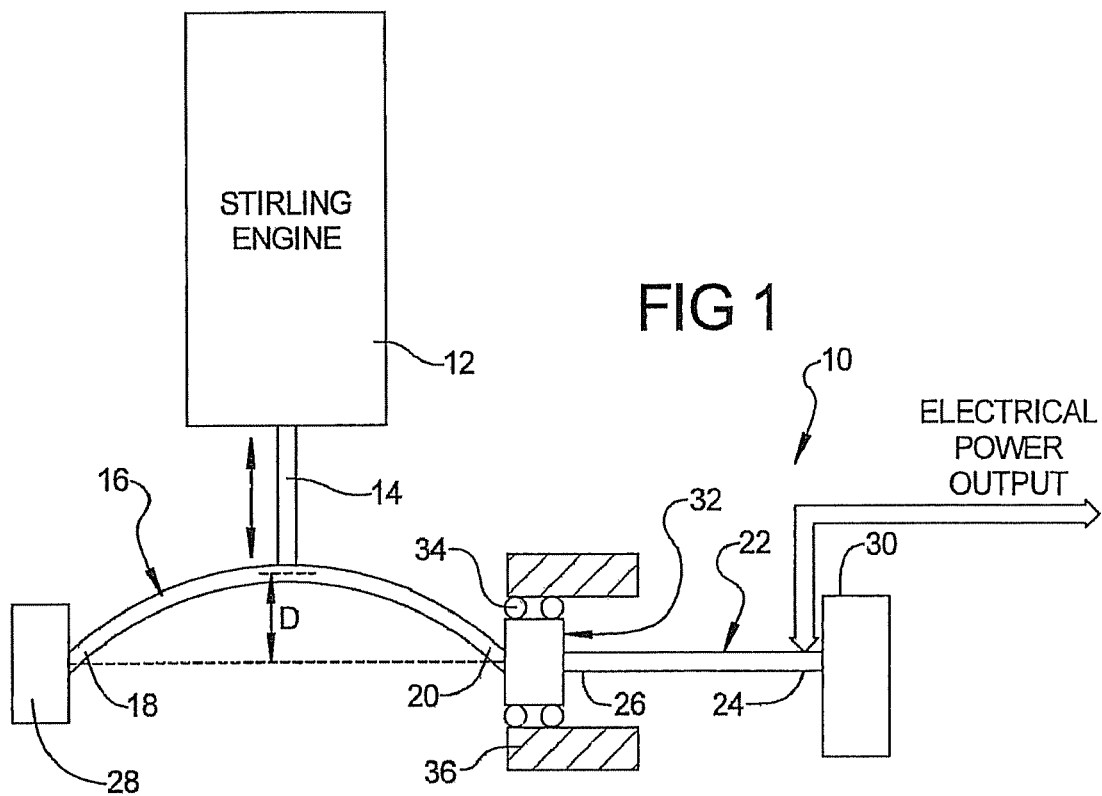
FIG. 1 is a simplified block diagram of a non-linear piezoelectric mechanical-to-electrical generator in accordance with one particular embodiment of the present disclosure, and showing a flexible beam and a piezoceramic stack of the apparatus in their initial orientations prior to an external mechanical force being applied to the flexible beam, with a Stirling engine being the device that is generating the mechanical input.

Referring to FIG. 1, there is shown a non-linear, mechanical-to-electrical generator apparatus 10 in accordance with one exemplary embodiment of the present disclosure. In this example, a Stirling engine 12 having a reciprocating output piston 14 is illustrated as the device that provides a mechanical input signal to the apparatus 10. However, it will be appreciated that any device that generates a reciprocating mechanical signal can be used with the apparatus 10. It is anticipated that the apparatus 10 will find particular utility in connection with a Stirling engine, as the apparatus 10 is able to readily convert the mechanical reciprocating motion of an output piston of such an engine to electric power. Stirling engines are discussed in the following patents, the disclosure of each of which is hereby incorporated by reference into the present disclosure: U.S. Pat. Nos. 6,871,495; 6,735,946 and 6,871,495.

The apparatus 10 includes a flexible beam 16 having a first end 18 and a second end 20. An electrically responsive member 22 in one form comprises a piezoceramic stack (i.e., a unitary stack of piezoelectric wafers), and has a first end 24 and a second end 26. Alternatively, the electrically responsive member 22 may be formed by a magnetostrictive material. The use of a piezoceramic stack or magnetostrictive material for the electrically responsive member 22 are both viewed as being equally applicable for use with the apparatus 10. Accordingly, while the following description will reference the electrically responsive member as "piezoceramic stack 22", it will be appreciated that a magnetostrictive material could readily be substituted in place of the piezoceramic material.

The flexible beam 16 may be formed from spring steel having a planar shape, as shown in FIG. 4, or as a planar leaf spring, or from any other material that is suitably flexible. The first end 18 of the flexible beam 16 is fixedly secured to a suitable support structure or frame member 28, while the first end 24 of the piezoceramic stack 22 is similarly fixedly secured to a support structure or frame member 30. The second ends 20 and 26 of the flexible beam 16 and the piezoceramic stack 22 may be secured directly to one another, or to an intermediate coupling assembly 32. Coupling assembly 32 includes a plurality of wheels 34 that are adapted to ride within a guide track or rail 36 to thus facilitate the smooth application and removal of a compressive force to/from the piezoceramic stack 22.

The flexible beam 16 and the piezoceramic stack 22 are also arranged such that their opposing free ends (i.e., ends 18, 20, 24 and 26) are all generally aligned along a common longitudinal axis extending through the piezoceramic stack 22. The Stirling engine 12 is preferably supported so that its piston 14 extends generally normal to the longitudinal axis extending through the piezoceramic stack 22. It will be appreciated that the stroke length of the piston 14 will be a factor that needs to be considered in determining the precise dimensions, and particularly the length, of the flexible beam 16.

With brief reference to FIG. 4, the flexible beam 16 has an overall (i.e., unbowed or "unbuckled") length "L", a thickness, and a width that may each vary widely to suit a specific application. In one exemplary form the length ("L") of the beam 16 is about 2.0 inches (50.4 mm), the width is about 0.5 inch (12.7 mm), and the thickness is about 0.030 inch (0.762 mm). The piezoceramic stack 22 may have a length that varies in accordance with the particular application with which the apparatus 10 is being interfaced with, and will be in part dependent on the length and stiffness of the flexible beam 16. In one exemplary form the uncompressed length of the piezoceramic stack may be about 0.5 inch (12.7 mm). The piezoceramic stack 22 may also take a variety of cross sectional shapes, for example rectangular, round, oval, square, or any other shape that might best suit the need of a particular application. In the present example, the piezoceramic stack 22 has a circular cross sectional shape having a diameter from about 0.375 inch to about 0.5 inch (9.525 mm-12.7 mm).

Figure 2:
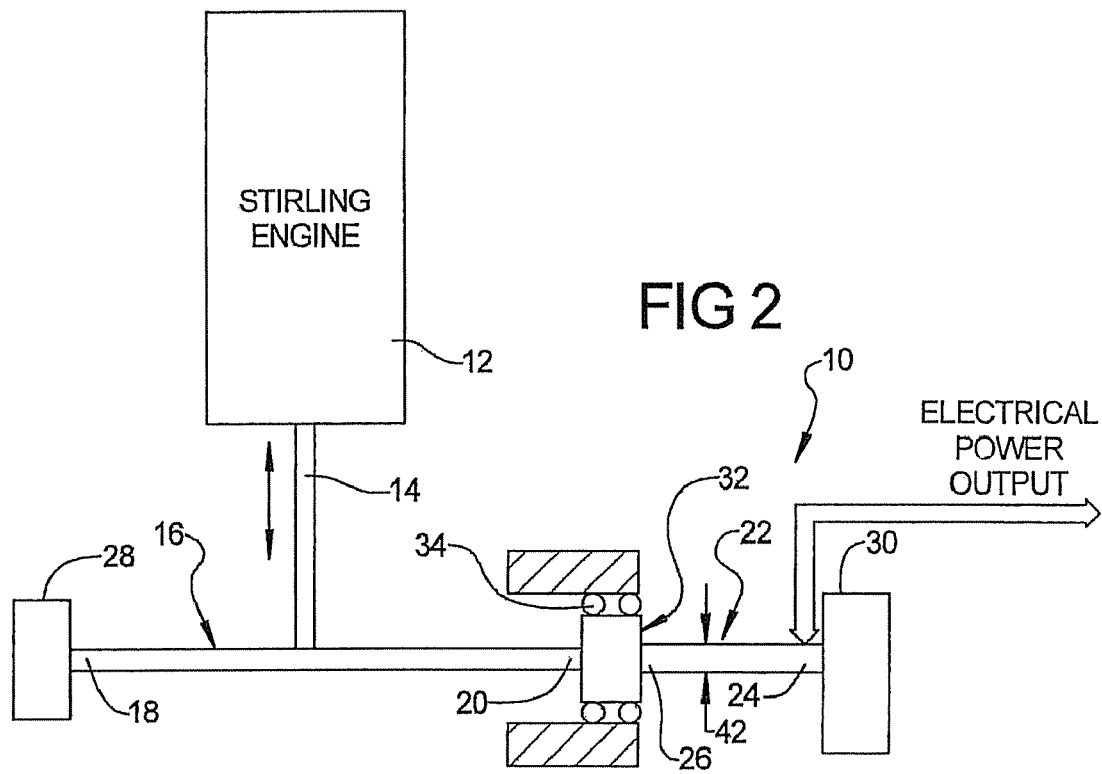
FIG. 2 is a simplified block diagram of the apparatus of FIG. 1, but with a piston of the Stirling engine extended to flatten the flexible beam, thus causing an increased compressive force to be exerted on the piezoceramic stack.

Referring now to FIGS. 1-3, the operation of the apparatus 10 will be described. Referring initially to FIG. 1, the flexible beam 16 assumes one stable position. In this orientation the flexible beam is exerting a first, or minimum, degree of compressive force on the piezoceramic stack 22, but a force that is not sufficient to tangibly compress the piezoceramic stack 22. As the output piston 14 of the Stirling engine 12 initially begins to extend, it exerts a mechanical input force on the flexible beam 16. This flattens the beam 16, as indicated in FIG. 2. As the flexible beam 16 is flattened, it exerts a significantly increased compressive force on the piezoceramic stack 22, which causes the piezoceramic stack 22 to generate an electric current pulse output from electrical contacts (not shown) connected to the various layers thereof. This electrical pulse has a first polarity, for example a positive polarity. The orientation of the flexible beam 16 shown in FIG. 2 also represents an "over center" position. By "over center", it is meant that the flexible beam 16 will rapidly flex past this point as it is being moved toward the orientation shown in either FIG. 1 or FIG. 3, but will be unstable in the orientation of FIG. 2. In the position of FIG. 2, the flexible beam 16 is exerting a maximum degree of compressive force on the piezoceramic stack 22.

With reference specifically to FIGS. 2 and 3, as the piston 14 of the Stirling engine 12 extends to its maximum stroke length, it moves the midpoint of the flexible beam 16 past the over center position shown in FIG. 2. The flexible beam 16 then begins to release the compressive force on the piezoceramic stack 22. The compressive force continues to decrease as the flexible beam 16 moves into the orientation shown in FIG. 3. Once in the orientation shown in FIG. 3, the flexible beam 16 is again exerting the same minimum force as it did in the orientation shown in FIG. 1. The orientation shown in FIG. 3 forms a second stable position for the flexible beam 16. As the flexible beam 16 moves from the orientation shown in FIG. 2 to that shown in FIG. 3, the decompression of the piezoceramic stack 22 causes the stack 22 to generate another electrical output pulse. This electrical pulse will, however, be of the opposite polarity to the pulse that was created by the compressive movement described in connection with the movement of the flexible beam 16 from the orientation shown in FIG. 1 to that shown in FIG. 2. Thus, each complete extension or complete retraction of the piston 14 generates two electrical pulses from the piezoceramic stack 22. One complete cycle of the piston 14 (i.e., one extension stroke and one retraction stroke) thus generates four electrical pulses from the piezoceramic stack 22.

A significant advantage of the bowed configuration of the flexible beam 16 is that the flexible beam effectively operates as a "strain amplifier". By this it is meant that a relatively small mechanical motion (i.e., short mechanical stroke) applied at the midpoint of the flexible beam 16 will cause the beam 16 to generate a significantly large compressive pressure on the piezoceramic stack 22. For example, the compressive pressure generated on the second end 26 of the piezoceramic stack 22 may be up to or greater than 100 times the compressive pressure that would otherwise be generated by a linear linkage applying a force to the second end 26 of the piezoceramic stack 22. Obviously, the degree of amplification achieved will depend on the stiffness of the flexible beam 16, the length of the beam 16 and other design criteria. The stiffness and length of the flexible beam 16 can be tailored to meet the needs of a particular application.

The change in length of the piezoceramic stack 22, as a result of a compressive pressure from the flexible beam 16, is represented by dimension 38 in FIG. 2. Mathematically, this displacement can be expressed by the following formula:

$$\Delta_{stack}^{Piezoceramic} = \frac{\pi^2 D^2}{4L}$$

where "D" represents the distance separating a line bisecting the free ends of the flexible beam 16, and a line tangent to the midpoint of the beam 16 (FIG. 1); and The "critical" force required to move the flexible beam 16 between its two stable positions described above may also vary to suit the needs of a specific application. The critical force is also sometimes referred to as the "critical buckling load". In the exemplary embodiment being discussed, the critical force "Pcr" can be expressed by the formula:

$$Pcr = \frac{\pi EI}{L^2}$$

where "E" is the elastic modulus of the material of the flexible beam 16;
where "I" is the area moment of inertia of the flexible beam 16; and
where "L" is the length of the flexible beam 16.

The apparatus 10 can also be used in connection with a Stirling engine to form a "refrigerator", by intermittently applying and removing an electric current to the piezoceramic stack 22 that causes intermittent bowing and unbowing of the stack 22. The apparatus 10 is also expected to find utility in other applications where an electrical power output signal is desired in response to linear movement of a mechanical member.

Figure 5:
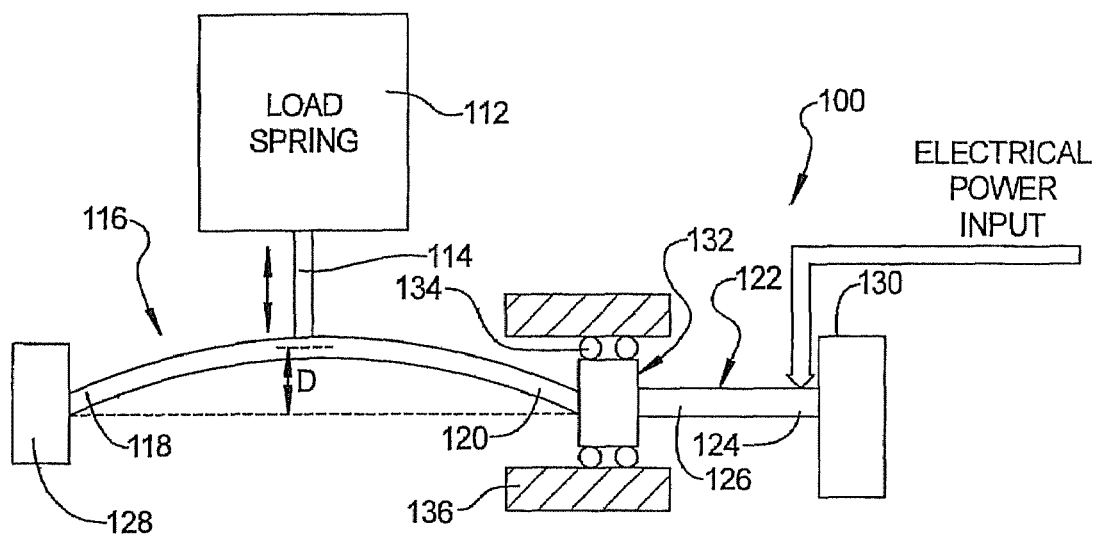
FIG. 5 is a simplified block diagram of one embodiment of an alternative implementation of the apparatus and method in which a piezoceramic stack is used to form an electrical-to-mechanical transducer to drive a load spring.

Referring to FIG. 5, a transducer in the form of an actuator apparatus 100 is shown in accordance with an alternative implementation of the teachings of the present disclosure. Components in common with those described in connection with apparatus 10 will be denoted by reference numerals increased by a factor of 100 over those used to describe the embodiment shown in FIGS. 1-4.

The apparatus 100 is substantially similar to the apparatus 10, and includes an electrically responsive member 122 which is installed under compression by a bowed flexible beam 116, which itself is also installed under compression to assume a slightly bowed or buckled shape. Again, the electrically responsive member 122 may be formed by a piezoceramic stack or by magnetostrictive material. For convenience, component 122 will be referred to as the "piezoceramic stack". The principal difference between apparatus 10 and apparatus 100 is that with apparatus 100, an electrical signal (e.g., a voltage) is alternately applied to and removed from the piezoceramic stack 122, which causes a corresponding alternating expansion (i.e., lengthening) and contraction (i.e., shortening lengthwise) of the stack 122. However, the flexible beam 116 in this embodiment does not flatten or move over center, as with the apparatus 10.

Figure 6:
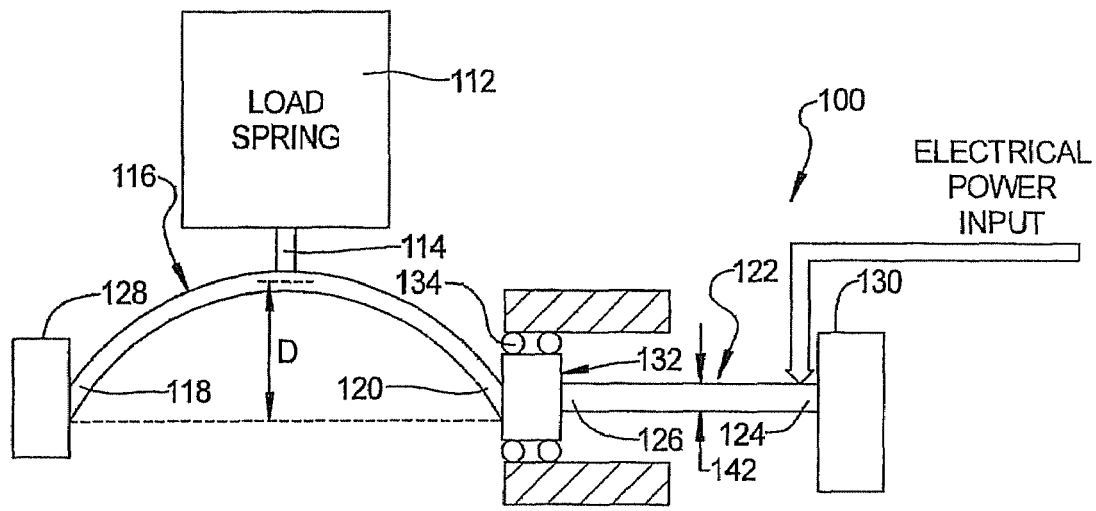
FIG. 6 is a block diagram of the apparatus of FIG. 5 but with a flexible beam of the apparatus being bowed by the force of the expanded piezoceramic beam, to thus drive an input member associated with a load spring in a linearly manner.

When the piezoceramic stack 122 lengthens, it urges coupling assembly 132 to move to the left, as indicated in FIG. 6. As this occurs, the flexible beam 116 is further bowed into the shape shown in FIG. 6. A linear member 114 in contact with the flexible beam 116 at an intermediate point along the length of flexible beam 116 is driven linearly as the flexible beam 116 bows. The member 114 moves in an up and down oscillating motion in accordance with the expansion and retraction of the piezoceramic stack 122. The member 114 may form a portion of a load spring 112 or any other device able to receive an oscillating mechanical signal.

An advantageous feature of the apparatus 100 is that the piezoceramic stack 122 provides a maximum available force at the beginning of its lengthening stroke, where the apparatus provides maximum stroke multiplication. At the end of the piezo stack 122 motion where available force is minimum, the motion amplification is minimum resulting in the ability of the apparatus to transfer more energy to a spring-like load than would be possible if the motion multiplication has a linear relationship.

The following equation shows the relationship between piezoceramic stack 122 motion and beam 116 center motion:

$$\frac{\Delta \text{Piezoelectric stack}}{D} = \frac{\pi^2 D}{2L}$$

where "D" is the distance separating a line bisecting the free ends of the beam 116 (FIG. 5) and a line tangent to the midpoint of the beam 116; and
where "L" is the unbent (i.e., flat or unbowed) length of the beam 116.

Figure 7:
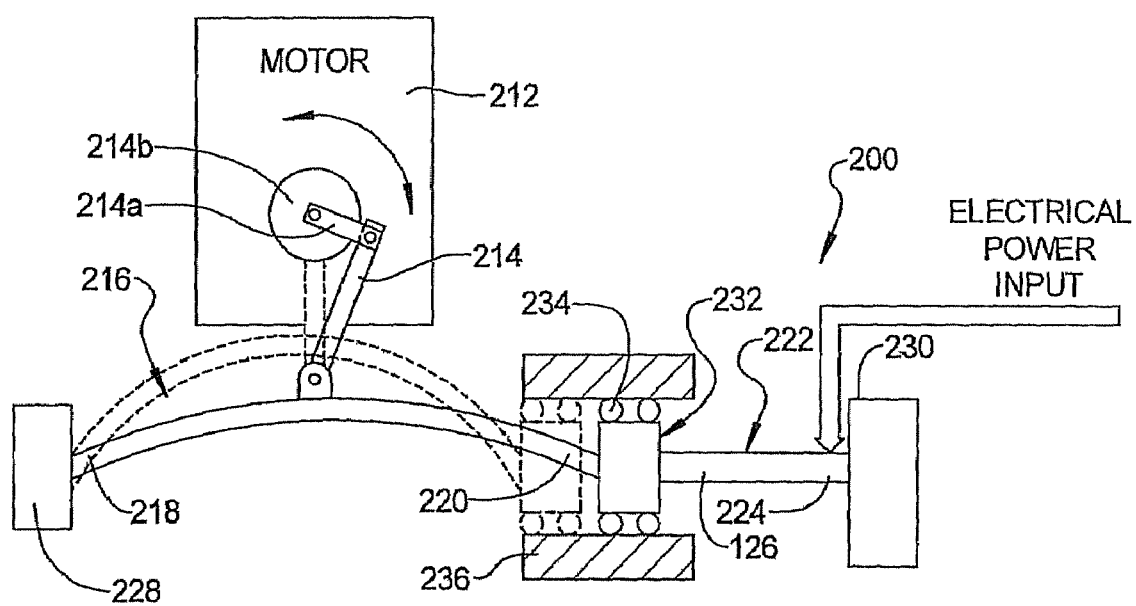
FIG. 7 is a simplified illustration showing how the apparatus of FIG. 5 could be configured to form a crankshaft-like driving arrangement to impart rotational movement to a rotationally supported member, to thus drive a motor.

Referring to FIG. 7, a motor apparatus 200 is illustrated in accordance with another embodiment of the present disclosure. The motor apparatus 200 is identical in construction to the apparatus 100 with the exception that an output member 214 is coupled pivotally at one end to a flexible beam 216. At its opposite end, the member 214 is pivotally coupled via a linkage assembly 214a to a rotationally mounted crank 214b. Apparatus 200 can thus be used to drive a crankshaft like output arrangement from the alternating bowing motion of the piezoceramic stack 222, to thus create rotational motion from the alternating compressing and decompressing of the piezoceramic stack 222.

While various embodiments and/or implementations have been described for the subject matter of the present disclosure, it will be appreciated that these are merely exemplary, and that other forms of transducers could be implemented from the teachings presented herein.

What is claimed is:

1. A non-linear power generator system comprising:
   a flexible beam for receiving a mechanical input signal, the flexible beam being supported in a bowed shape;
   an electrically responsive member supported adjacent one end of the flexible beam so as to be under a compressive force exerted by said flexible beam; and
   said flexible beam being adapted to move towards a flattened shape from said bowed shape in response to said mechanical input signal, to transmit said mechanical input signal to said electrically responsive member, to cause a compression of said electrically responsive member that results in an electrical output signal being generated by said electrically responsive member.

2. The system of claim 1, wherein said mechanical input signal comprises an oscillating mechanical input signal.

3. The system of claim 2, wherein said mechanical input signal is provided by a piston of a Stirling engine.

4. The system of claim 1, further comprising a coupling assembly including a plurality of wheels for interfacing an end of said flexible beam to an end of said electrically responsive member.

5. The system of claim 1, wherein a change in a length of said electrically responsive member is approximated by a formula:

$$\Delta \text{length of electrically responsive member} = \frac{\pi^2 D^2}{4L}$$

where "D" represents a distance separating a line bisecting free ends of the flexible beam, and a line tangent to a midpoint of the flexible beam; and
   where "L" represents a length of the flexible beam in an unbowed condition.

6. The system of claim 1, wherein said flexible beam provides a varying force amplification factor approximated by a following equation:

$$Fm = \frac{\pi^2 D}{2L}$$

where Fm is a force magnification factor of said mechanical input signal.

7. The system of claim 1, wherein said electrically responsive member comprises a piezoceramic stack.

8. The system of claim 1, wherein said electrically responsive member comprises a magnetostrictive material.

9. A non-linear, mechanical-to-electrical power generator, comprising:
   a flexible beam secured at a first end to a first structure, and at a second end to a coupling assembly, and being held between said first structure and said coupling assembly in a compressed, non-linear orientation;
   an electrically responsive member supported adjacent said flexible beam and adjacent to a second structure; and
   said flexible beam adapted to receive a mechanical input force at a point along its length that flexes said flexible beam towards a linear orientation, and concurrently causes said electrically responsive member to experience an increased compressive force, to generate an electrical output signal.

10. The generator of claim 9, wherein said flexing of said flexible beam from said compressed, non-linear orientation towards said linear orientation comprises moving said flexible beam from a bowed shape to a flattened shape.

11. The generator of claim 9, wherein movement of said flexible beam causes said flexible beam to move from a bowed shape to a flattened shape, and wherein said movement into said flattened shape provides an amplification factor of at least about four over a force associated with said mechanical input force.

12. The generator of claim 9, wherein said mechanical input force is directed along a path generally normal to said flexible beam.

13. The generator of claim 9, further comprising a plurality of wheels for supporting the coupling assembly to enable linear rolling movement of the coupling assembly along a surface.

14. The generator of claim 9, wherein a change in a length of said electrically responsive member is approximated in relation to said flexible beam by a formula comprising:

$$\Delta \text{length of electrically responsive member} = \frac{\pi^2 D^2}{4L}$$

where "D" represents a distance separating a line bisecting free ends of the flexible beam, and a line tangent to a midpoint of the flexible beam; and
   where "L" represents the length of the flexible beam in an unbowed condition.

15. The generator of claim 9, wherein movement of said flexible beam from said compressed, non-linear orientation toward said linear orientation, and then to another compressed, non-linear orientation, causes said electrically responsive member to generate two distinct electrical signals.

16. The generator of claim 9, wherein said electrically responsive member comprises a piezoceramic stack.

17. The generator of claim 9, wherein said electrically responsive member is comprised of a magnetostrictive material.

18. A method for generating electrical power from a mechanical input signal, comprising:
   using a flexible beam secured under compression to assume a bowed orientation, to receive said mechanical input signal;
   using said flexible beam to transmit said mechanical input signal to an electrically responsive member;
   supporting said electrically responsive member such that said electrically responsive member experiences a compressive stress from said flexible beam when said flexible beam moves from said bowed orientation to a flattened orientation; and
   using said flexible beam to alternatively compress, and to permit decompression, of said electrically responspon-sive member, in response to said mechanical input signal, to generate electrical output signals from said electrically responsive member.

19. The method of claim 18, wherein using said flexible beam to transmit said mechanical input signal comprises using said flexible beam to also amplify said mechanical input signal as said mechanical input signal is applied by said flexible beam to said electrically responsive member.

20. The method of claim 18, further comprising using a Stirling engine to generate said mechanical input signal.

* * * * *